US009076793B2

(12) United States Patent
 Tanaka

(10) Patent No.: US 9,076,793 B2
(45) Date of Patent: Jul. 7, 2015

(54) SEMICONDUCTOR DEVICE AND MANUFACTURING METHOD THEREOF

(71) Applicant: PS4 LUXCO S.A.R.L., Luxembourg (LU)

(72) Inventor: Katsuhiko Tanaka, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 13/669,670

(22) Filed: Nov. 6, 2012

(65) Prior Publication Data

US 2013/0154096 A1    Jun. 20, 2013

(30) Foreign Application Priority Data

Dec. 19, 2011    (JP) ................. 2011-277346

(51) Int. Cl.
  *H01L 23/532*   (2006.01)
  *H01L 23/522*   (2006.01)
  *H01L 21/285*   (2006.01)
  *H01L 21/768*   (2006.01)

(52) U.S. Cl.
  CPC ...... *H01L 23/53266* (2013.01); *H01L 23/5226* (2013.01); *H01L 21/2855* (2013.01); *H01L 21/76843* (2013.01)

(58) Field of Classification Search
  CPC ....... H01L 21/20; H01L 21/44; H01L 23/145; H01L 23/48; H01L 23/52; H01L 29/40; H01L 29/94; H01L 29/76; H01L 29/78; H01L 23/532; H01L 21/285
  USPC ......... 257/751, 774, 753, 750, 763, 767, 770, 257/754
  See application file for complete search history.

(56) References Cited

U.S. PATENT DOCUMENTS

| 5,391,517 | A  | * | 2/1995 | Gelatos et al. ............... 438/687 |
| 6,200,895 | B1 | * | 3/2001 | Givens et al. ................ 438/688 |
| 7,524,756 | B2 | * | 4/2009 | Huglin et al. ................ 438/629 |
| 2002/0123159 | A1 | * | 9/2002 | Chi et al. ....................... 438/3 |
| 2003/0203622 | A1 | * | 10/2003 | Tripathi et al. .............. 438/653 |
| 2008/0054326 | A1 | * | 3/2008 | Wong et al. .................. 257/300 |
| 2010/0171185 | A1 | * | 7/2010 | Moon et al. .................. 257/384 |

FOREIGN PATENT DOCUMENTS

| JP | 11-087272 | 3/1999 |
| JP | 2001-168057 | 6/2001 |

* cited by examiner

*Primary Examiner* — Chuong A Luu

(57) ABSTRACT

In a manufacturing method of a barrier layer, a via hole is formed in an insulating layer that covers a conductive layer over a substrate, and then the barrier layer is formed in the via hole. The barrier layer is provided by forming a second titanium nitride film after forming a first titanium nitride film. The second titanium nitride film is formed using a method having a weak anisotropy than the first titanium nitride film.

9 Claims, 5 Drawing Sheets

SEMICONDUCTOR DEVICE AND MANUFACTURING METHOD THEREOF

This application is based upon and claims the benefit of priority from Japanese Patent Application No. 2011-277346 filed on Dec. 19, 2011, the disclosure of which is incorporated herein in its entirety by reference.

BACKGROUND OF THE INVENTION

1. Field of the Invention

The present invention relates to a method for manufacturing a semiconductor device and manufacturing method thereof.

2. Description of the Related Art

Conventionally, a titanium film (Ti film) has been used in a portion of a contact conductive plug to make contact with a semiconductor substrate (for example, a silicon substrate) and an aluminum conductive layer (aluminum film), in order to reduce the contact resistance of the semiconductor substrate and the aluminum conductive layer with the contact conductive plug.

In addition, a titanium nitride film (TiN film) is used in the contact conductive plug as one of the constituent elements thereof, in order to stabilize the film-forming reaction of a tungsten film composing the contact conductive plug and ensure the adhesiveness of the tungsten film to a foundation insulating layer.

Since a $WF_6$ gas used when the tungsten film is formed reacts with titanium (Ti), silicon (Si) or aluminum (Al) to cause film delamination, these materials need to be covered and protected with a titanium nitride film (TiN film).

JP2001-168057A discloses a semiconductor device manufacturing method in which the delamination of a barrier metal film is suppressed when a tungsten film is buried in a contact hole through a barrier metal. In this method, a titanium film is sputter-formed on an upper surface of a substrate including a contact hole. Then, a first titanium nitride film is sputter-formed on the titanium film in a nitrogen atmosphere, while heating the substrate with a high-temperature Ar gas. Next, a second titanium nitride film is sputter-formed in a 100% nitrogen atmosphere, so as to cover the first titanium nitride film. Thereafter, the contact hole is filled with the tungsten film through a barrier metal film composed of a laminated film including the titanium film, the first titanium nitride film, and the second titanium nitride film.

JP11-87272A discloses a manufacturing method in which a high-quality tungsten film can be formed on a TiN film. In this method, a silicon oxide film is formed on a silicon substrate. Then, the silicon oxide film is patterned into a contact hole shape to fabricate a base substrate. Next, a 30 nm-thick Ti film is formed on exposed portions of the silicon substrate and on the silicon oxide film by a sputtering deposition method. Subsequently, a 60-second nitrogen plasma treatment is performed under the temperature, pressure and power conditions of 400° C., 1 Torr and 300 W, respectively, to nitride a surface of the Ti film. Then, a 50 nm-thick TiN film is formed by a sputtering deposition method. Thereafter, a 350 nm-thick tungsten film is formed on the TiN film by a CVD method.

JP11-87272A discloses another method for forming a tungsten film. In this method, an 800 nm-thick Al film is formed first by a sputtering deposition method, and then a 30 nm-thick Ti film (titanium film) is formed on the Al film by a sputtering deposition method. Subsequently, a 60-second nitrogen plasma treatment is performed under the temperature, pressure and power conditions of 400° C., 1 Torr and 300 W, respectively, to nitride a surface of the Ti film. Then, a 100 nm-thick TiN film (titanium nitride film) is formed by a sputtering deposition method. Subsequently, a silicon oxide film is formed on the TiN film by a plasma CVD method and patterned into a contact hole shape. Next, a 50 nm-thick TiN film is formed on exposed portions of the TiN film and on the silicon oxide film by a sputtering deposition method. Thereafter, an 800 nm-thick tungsten film is formed on the TiN film by a CVD method.

If any portion of the titanium nitride film covering the titanium film formed on silicon or an aluminum conductive layer is insufficient in thickness, however, the tungsten film may suffer film delamination or react with $WF_6$ to produce volcanoes, unless the heating treatment mentioned in JP2001-168057A or JP11-87272A is performed.

As the result of keen examination, the present inventor has found that if the heating treatment mentioned in JP2001-168057A and JP11-87272A is performed while the titanium film (Ti film) is in contact with a copper conductive layer (Cu film), the state of contact between the Cu film and the Ti film becomes unstable, and therefore, the contact resistance between a conductive plug (a contact conductive plug, a via conductive plug, or the like) including the Ti film as one of the constituent elements thereof and the copper conductive layer increases and varies within a plane of a semiconductor substrate.

If the heating treatment is performed after the formation of the titanium nitride film (TiN film) on the copper conductive layer (Cu film), the barrier properties of the titanium nitride film (TiN film) with respect to Cu degrade, thus causing copper atoms to be liable to diffusion. Consequently, the present inventor has also found that the electromigration (EM) resistance of the bottom of the conductive plug decreases, and the nucleus-forming reaction of the tungsten film (base material of the conductive plug) on a surface of the titanium nitride film (TiN film) becomes unstable, thus leading to the anomalous growth of the tungsten film.

SUMMARY OF THE INVENTION

In one embodiment, there is provided a manufacturing method of a semiconductor device, comprising:

forming a via hole in an insulating layer that covers a conductive layer over a substrate; and forming a barrier layer in the via hole, wherein the barrier layer is provided by forming a second titanium nitride film after forming a first titanium nitride film, and wherein the second titanium nitride film is formed using a method having a weak anisotropy than the first titanium nitride film.

In another embodiment, there is provided a manufacturing method of a semiconductor device, comprising:

forming a via hole in an insulating layer covering a conductive layer over a substrate;

forming a titanium film at least on a bottom surface of the via hole and an upper surface of the insulating layer, wherein the titanium film is formed in a strong anisotropic sputtering chamber;

forming a first titanium nitride film on the titanium film in the strong anisotropic sputtering chamber;

forming a second titanium nitride film on the first titanium nitride film in a weak anisotropic sputtering chamber; and forming a tungsten layer on the second titanium nitride film.

In another embodiment, there is provided a semiconductor device comprising:

a conductive layer over a substrate;

an insulating layer covering the conductive layer;

a titanium film concealing at least a part of the conductive layer;

a first titanium nitride film including first and second portions, the first portion concealing the titanium film over the part of the conductive layer, the second portion extending along a side surface of the insulating layer in a via hole, wherein the via hole is formed in the insulating layer exposing the part of the conductive layer;

a second titanium nitride film covering the first titanium nitride film at an upper part of the via hole; and a conductive plug filling in the via hole through a barrier layer that includes the titanium film, the first titanium nitride film and the second titanium nitride film.

BRIEF DESCRIPTION OF THE DRAWINGS

The above features and advantages of the present invention will be more apparent from the following description of certain preferred embodiments taken in conjunction with the accompanying drawings, in which.

Figure 1:
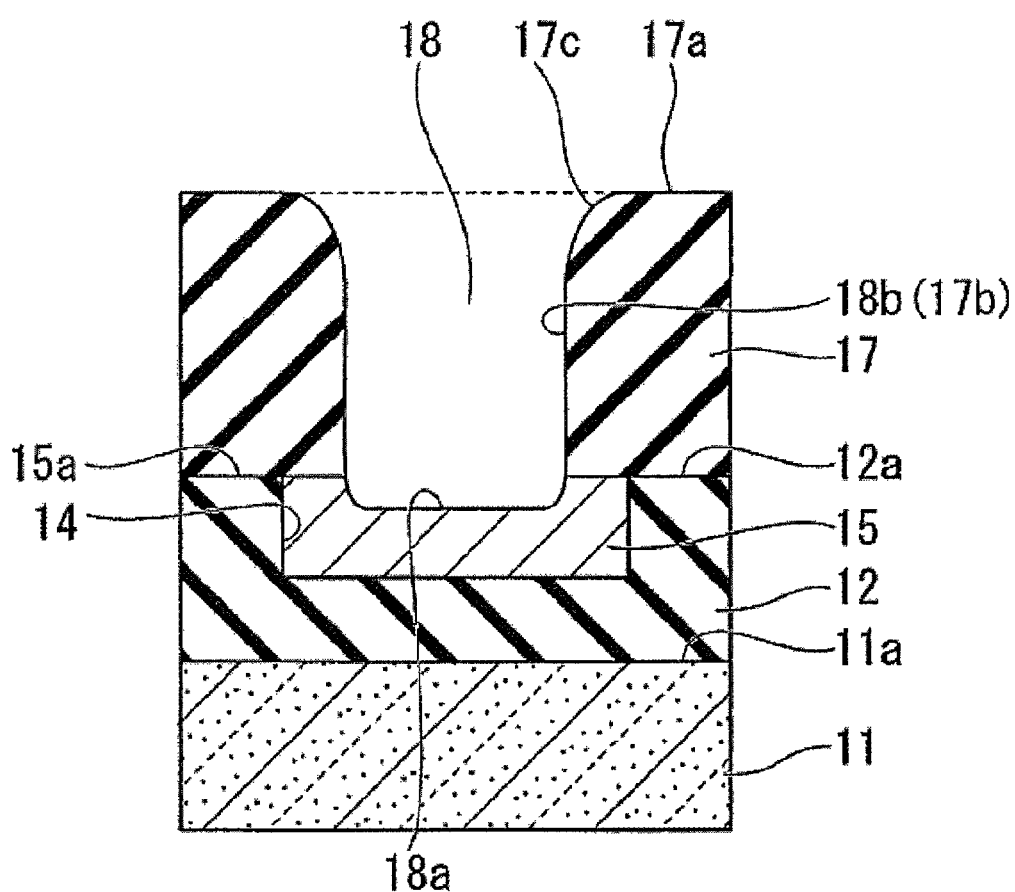
FIG. 1 is a cross-sectional view used to describe a process of manufacturing a semiconductor device according to an exemplary embodiment of the present invention.

In the drawings, numerals have the following meanings, 10: semiconductor device, 11: semiconductor substrate, 11a: principal surface, 12: foundation insulating film, 12a, 15a, 17a and 27a: upper surface, 15: copper conductive layer, 17: insulating layer, 17b: side surface, 17c: shoulder, 18: via hole, 18a: bottom surface, 18b: sidewall surface, 21: titanium film, 22: first titanium nitride film, 24: second titanium nitride film, 25: barrier layer, 27: tungsten film, and 31: conductive plug.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIGS. 1 to 5 are cross-sectional views used to describe a process of manufacturing a semiconductor device according to an exemplary embodiment of the present invention. A method for manufacturing semiconductor device 10 (see FIG. 5) of the present exemplary embodiment (specifically, a method for forming conductive plug 31) will be described with reference to FIGS. 1 to 5.

First, in the step illustrated in FIG. 1, foundation insulating film 12 (for example, a silicon oxide film ($SiO_2$ film)) is formed on principal surface 11a (front surface) of semiconductor substrate 11 (for example, a monocrystalline silicon substrate) by a known technique. Next, trench 14 is formed in foundation insulating film 12 by lithography and dry etching techniques.

Subsequently, copper conductive layer 15 for filling trench 14 is formed by a known technique (damascene method). Then, insulating layer 17 for covering upper surface 12a of foundation insulating film 12 and upper surface 15a of copper conductive layer 15 is formed by a known technique (for example, a CVD method). Next, via hole 18 to expose therein part of copper conductive layer 15 is formed (opened) by photolithographic and dry etching techniques in a portion of insulating layer 17 positioned on copper conductive layer 15.

Figure 2:
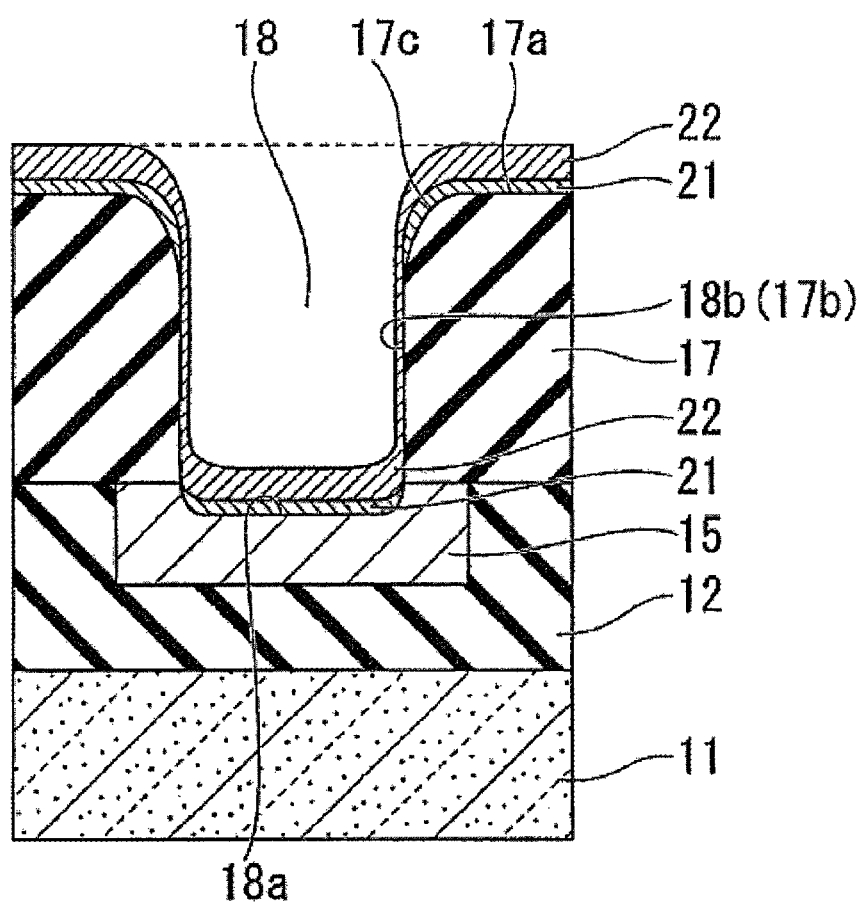
FIG. 2 is another cross-sectional view used to describe the process of manufacturing the semiconductor device according to the exemplary embodiment of the present invention.

Subsequently, an oxide formed on a surface of copper conductive layer 15 exposed in via hole 18 is removed prior to forming later-described titanium film 21 illustrated in FIG. 2. Specifically, the structure illustrated in FIG. 1 is reduction-treated in a hydrogen atmosphere, or the oxide is removed by sputter etching using Ar.

Subsequently, in the step illustrated in FIG. 2, titanium film 21 is formed so as to include at least a portion which substantially completely covers part of copper conductive layer 15. Specifically, titanium film 21 is formed at least on bottom surface 18a of via hole 18 and on upper surface 17a of insulating layer 17 within a strong anisotropic sputtering chamber. The phrase "strong anisotropic sputtering chamber" as used herein refers to a sputtering chamber in which the distance between the Ti target of a sputtering apparatus and semiconductor substrate 11 is long.

A long-throw sputtering deposition method whose bias power to a substrate is specified as 100 to 400 watts is used at the time of forming titanium film 21. Too high a bias power to a substrate (higher than 400 watts) increases the contact resistance between copper conductive layer 15 and titanium film 21, and therefore, not preferable.

Titanium film 21 is preferably formed so that a portion thereof formed on bottom surface 18a of via hole 18 (i.e., a surface of copper conductive layer 15 exposed in via hole 18) is 2 to 7.5 nm in thickness. In addition, titanium film 21 has only to be formed at least on the surface of copper conductive layer 15 exposed in via hole 18, and is not preferably formed on sidewall surface 18b of via hole 18. In FIG. 2, a case is cited as one example in which titanium film 21 is not formed on sidewall surface 18b of via hole 18.

As described above, titanium film 21 is formed, using a long-throw sputtering deposition method whose bias power to a substrate is specified as 100 to 400 watts, so that a portion of titanium film 21 formed on bottom surface 18a of via hole 18 is 2 to 7.5 nm in thickness. Accordingly, the contact resistance between copper conductive layer 15 and titanium film 21 can be lowered and a variation in the contact resistance within a plane of semiconductor substrate 11 can be reduced.

Subsequently, there is formed a first titanium nitride film 22 which extends from the portion of titanium film 21 formed on bottom surface 18a of via hole 18 (i.e., a portion of titanium film 21 which substantially completely covers part of copper conductive layer 15 (the portion exposed in via hole 18)), through side surface 17b of insulating layer 17 (i.e., sidewall surface 18b of via hole 18) which defines via hole 18, to upper surface (front surface) 17a of insulating layer 17, within a strong anisotropic first sputtering chamber. A portion of this first titanium nitride film 22 which substantially completely covers the portion of titanium film 21 covering the part of copper conductive layer 15 exposed in via hole 18 constitutes a first portion. In addition, a portion of first titanium nitride film 22 which extends along side surface 17b of insulating layer 17 in via hole 18 constitutes a second portion. Since first titanium nitride film 22 is formed using the strong anisotropic sputtering chamber, the second portion is smaller in film thickness than the first portion. The phrase "strong anisotropic sputtering chamber" as used herein refers to a sputtering chamber in which the distance (first distance) between the Ti target of a sputtering apparatus and semiconductor substrate 11 is long.

Consequently, titanium film 21 formed on bottom surface 18a of via hole 18 and on upper surface 17a of insulating layer 17 and sidewall surface 18b of via hole 18 on which titanium film 21 is not formed are covered with first titanium nitride film 22.

Specifically, first titanium nitride film 22 is formed by a long-throw sputtering deposition method utilizing reactive sputtering in a nitrogen atmosphere. A power of 400 to 1000 watts is applied as a bias power to a substrate at this time. Anisotropy during film-forming becomes stronger at the abovementioned bias power to a substrate applied when first titanium nitride film 22 is formed than titanium film 21 formed underneath first titanium nitride film 22. It is possible, however, to cover the portion of titanium film 21 formed on bottom surface 18a of via hole 18 by increasing the thickness of first titanium nitride film 22.

First titanium nitride film 22 is preferably formed so that a portion thereof on the portion of titanium film 21 located on bottom surface 18a of via hole 18 is 15 to 30 nm in thickness. Furthermore, first titanium nitride film 22 is preferably formed so that the composition ratio of titanium and nitrogen composing first titanium nitride film 22 is close to 1:1.

As described above, first titanium nitride film 22 is formed, using a long-throw sputtering deposition method using a bias power to a substrate of 400 to 1000 watts, so that a portion of first titanium nitride film 22 is 15 to 30 nm in thickness on the portion of titanium film 21 located on bottom surface 18a of via hole 18. Accordingly, the range of coverage of first titanium nitride film 22 on bottom surface 18a of via hole 18 can be adjusted.

Subsequently, in the step illustrated in FIG. 3, second titanium nitride film 24 is formed on first titanium nitride film 22, within the second sputtering chamber (another chamber different from the chamber used to form first titanium nitride film 22) weaker in anisotropy than the sputtering chamber used to form first titanium nitride film 22. The phrase "weakly anisotropic sputtering chamber" as used herein refers to an usual chamber in which the distance (second distance) between the Ti target of a sputtering apparatus and semiconductor substrate 11 is short.

Figure 3:
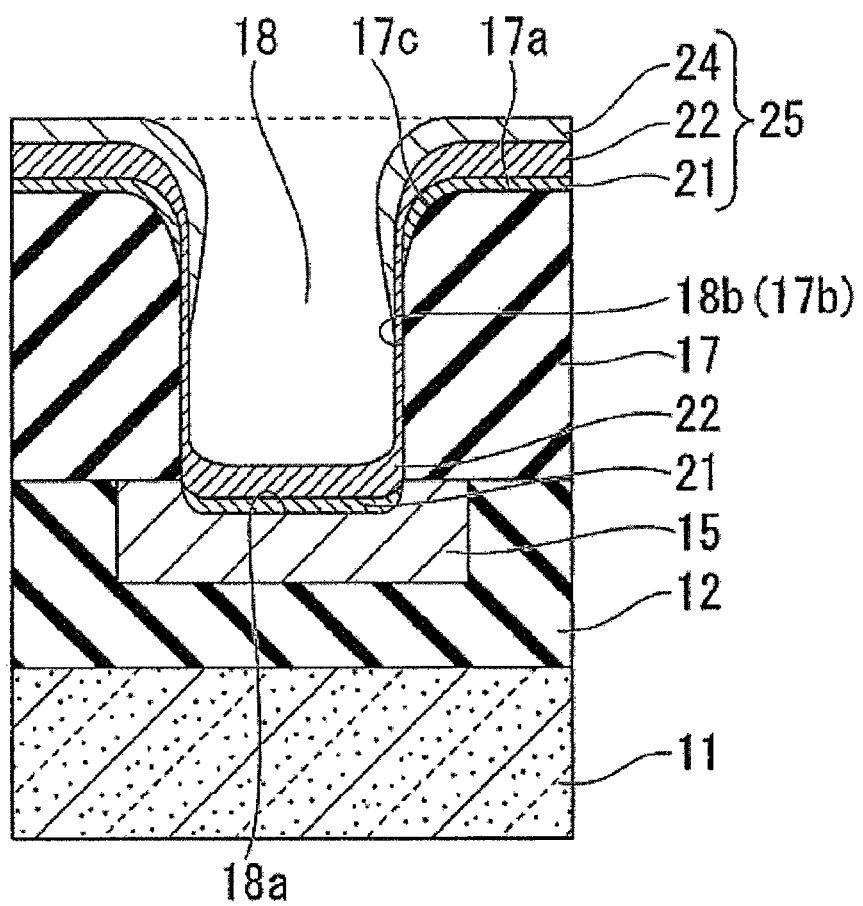
FIG. 3 is yet another cross-sectional view used to describe the process of manufacturing the semiconductor device according to the exemplary embodiment of the present invention.

Specifically, in the step illustrated in FIG. 3, second titanium nitride film 24 is formed by a usual sputtering deposition method (specifically, reactive sputtering using a nitrogen gas) rather than a long-throw sputtering deposition method, so as to cover at least a portion of first titanium nitride film 22 corresponding to shoulder 17c extending from side surface 17b of insulating layer 17 (sidewall surface 18b of via hole 18) to upper surface 17a of insulating layer 17, in a thickness larger than the thickness of the abovementioned portion. That is, second titanium nitride film 24 is larger in thickness than first titanium nitride film 22 in an upper portion of via hole 18. In addition, second titanium nitride film 24 is formed so that the thickness thereof is large in the upper portion of via hole 18 and gradually becomes smaller toward copper conductive layer 15 (in the depth direction of via hole 18). Furthermore, a thin portion of second titanium nitride film 24, though not illustrated in FIG. 3 and subsequent figures, is also formed above copper conductive layer 15. The thickness of second titanium nitride film 24 at this location is smaller than the thickness of first titanium nitride film 22 positioned between copper conductive layer 15 and second titanium nitride film 24.

The steps described heretofore form, within via hole 18, barrier layer 25 which includes titanium film 21, first titanium nitride film 22 and second titanium nitride film 24 and in which first titanium nitride film 22 and second titanium nitride film 24 are laminated in this order.

The distance between a Ti target and semiconductor substrate 11 in the strong anisotropic sputtering chamber is longer than the distance between the Ti target and semiconductor substrate 11 in the weakly anisotropic sputtering chamber.

In the step illustrated in FIG. 3, second titanium nitride film 24 is formed so that the thickness thereof formed on upper surface 17a and shoulder 17c of insulating layer 17 is 10 to 40 nm. In addition, second titanium nitride film 24 is preferably formed so that the composition ratio of titanium and nitrogen composing second titanium nitride film 24 is close to 1:1.

Figure 4:
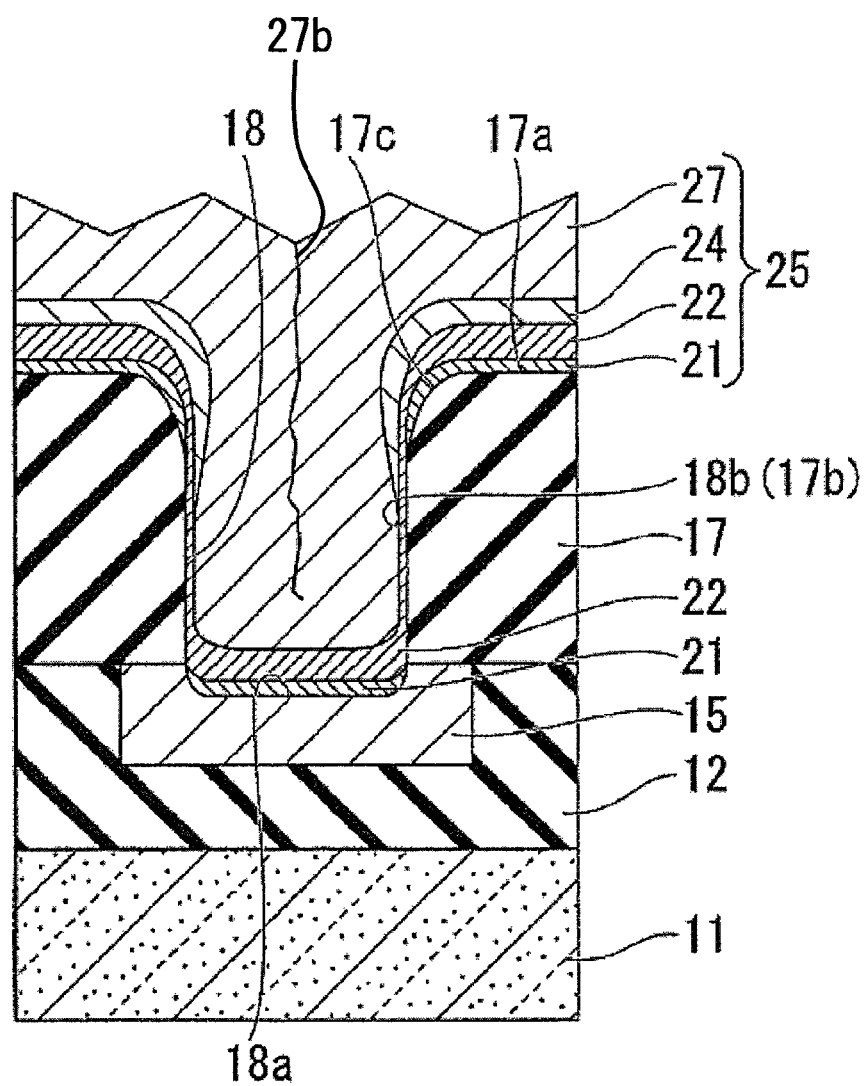
FIG. 4 is still another cross-sectional view used to describe the process of manufacturing the semiconductor device according to the exemplary embodiment of the present invention.

In the later-described step illustrated in FIG. 4, second titanium nitride film 24 has the function of protecting titanium film 21 formed in an area from shoulder 17c to upper surface 17a of insulating layer 17 (i.e., titanium film 21 formed in an area from the vicinity of an upper end of via hole 18 to surface of insulating layer 17) by using $WF_6$ which is a process gas used when tungsten film 27 is formed. Second titanium nitride film 24 may be formed at a certain thickness, and therefore, can be formed under commonly-used sputtering conditions.

Subsequently, in the step illustrated in FIG. 4, tungsten film 27 for filling via hole 18 is formed through titanium film 21, first titanium nitride film 22, the second titanium nitride film 24 by a CVD method using $WF_6$ as a process gas. At this time, tungsten film 27 is formed so as to cover second titanium nitride film 24 formed above upper surface 17a of insulating layer 17. Seam 27b arises in a portion of tungsten film 27 near the middle of via hole 18.

Figure 5:
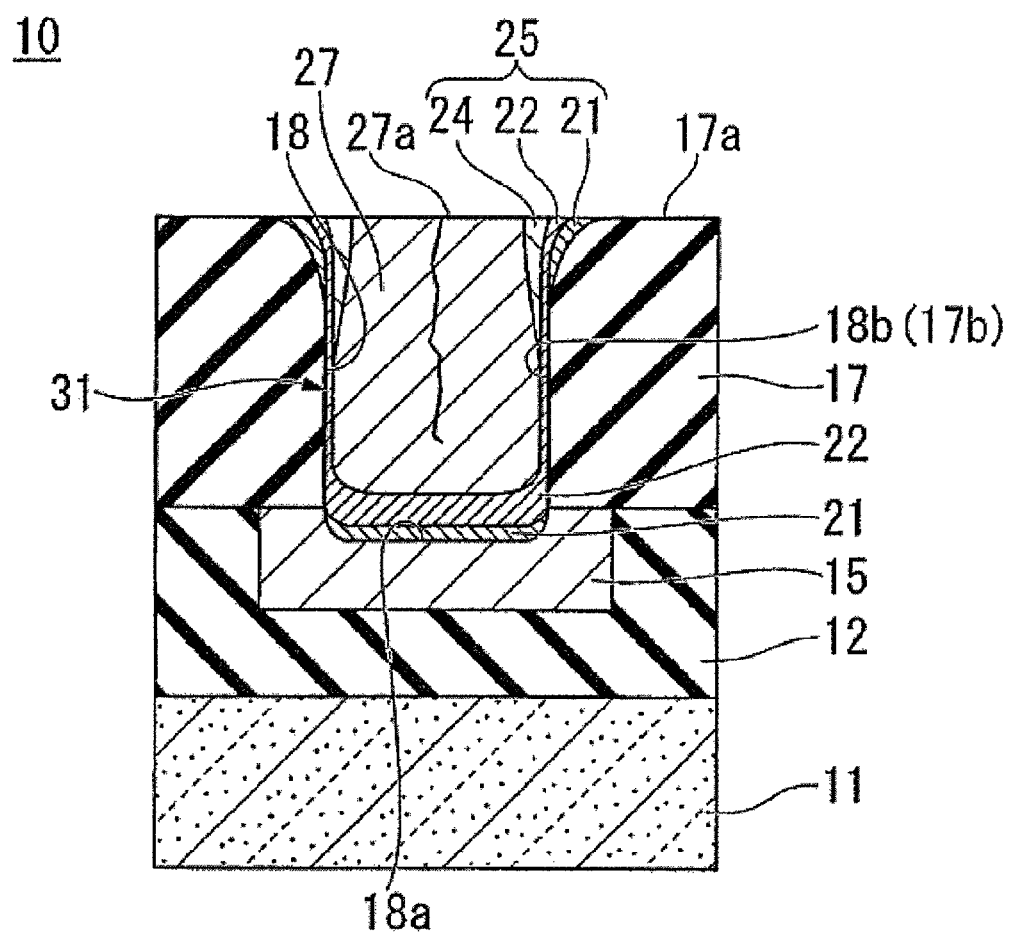
FIG. 5 is still another cross-sectional view used to describe the process of manufacturing the semiconductor device according to the exemplary embodiment of the present invention.

Subsequently, in the step illustrated in FIG. 5, unnecessary portions of titanium film 21, first titanium nitride film 22, and second titanium nitride film 24 formed on upper surface 17a of insulating layer 17 are removed by a CMP method, so that upper surface 27a of tungsten film 27 is level with upper surface 17a of insulating layer 17 after polishing.

This step causes upper surface 17a of insulating layer 17 to become exposed, and forms conductive plug 31 which is composed of titanium film 21, first titanium nitride film 22, second titanium nitride film 24 and tungsten film 27, and fills via hole 18. Conductive plug 31 is electrically connected to copper conductive layer 15.

According to the method for manufacturing a semiconductor device of the present exemplary embodiment, via hole 18 is formed in insulating layer 17 covering copper conductive layer 15 formed on foundation insulating film 12. Subsequently, titanium film 21 is formed at least on bottom surface 18a of via hole 18 and upper surface 17a of insulating layer 17 within a strong anisotropic sputtering chamber. Then, first titanium nitride film 22 is formed on titanium film 21 within the strong anisotropic sputtering chamber. Next, second titanium nitride film 24 is formed on first titanium nitride film 22 within a weakly anisotropic sputtering chamber. Thereafter, tungsten film 27 for filling via hole 18 is formed through titanium film 21, first titanium nitride film 22 and second titanium nitride film 24, thereby forming conductive plug 31 composed of titanium film 21, first titanium nitride film 22, second titanium nitride film 24 and tungsten film 27 in via hole 18. Consequently, the occurrence of volcanoes due to the formation of tungsten film 27 can be suppressed while ensuring electromigration (EM) resistance, without having to perform a heating treatment in the formation of titanium film 21, first titanium nitride film 22 and second titanium nitride film 24. As a result, via hole 18 can be satisfactorily filled with tungsten film 27, a variation in the contact resistance between copper conductive layer 15 and conductive plug 31 within a plane of semiconductor substrate 11 can be reduced, and therefore, excellent contact resistance can be obtained.

In the present invention, it is extremely important to first form first titanium nitride film 22 under strong anisotropic conditions, and then form second titanium nitride film 24 under weakly anisotropic conditions. Incidentally, if the first titanium nitride film is formed using weakly anisotropic conditions, an overhang shape is formed by the first titanium nitride film near an upper end of via hole 18. As described above, if the second titanium nitride film is formed under strong anisotropic conditions after the first titanium nitride film is formed into an overhang shape, coverage at a pattern edge of bottom surface 18a of via hole 18 degrades, thus inducing film delamination.

Accordingly, in order to form conductive plug 31 which has a small variation within a plane of semiconductor substrate 11 and an excellent resistance value, it is extremely important to first form first titanium nitride film 22 under strong anisotropic conditions, and then form second titanium nitride film 24 under weakly anisotropic conditions.

The present exemplary embodiment has been described by citing copper conductive layer 15 as one example of a conductive layer to which a lower end of conductive plug 31 is connected. However, an aluminum conductive layer (not illustrated) may be formed in place of copper conductive layer 15. Then, after the formation of insulating layer 17 for covering the aluminum conductive layer, via hole 18 to expose therein part of the aluminum conductive layer may be formed (opened) by photolithographic and dry etching techniques. Thereafter, the steps illustrated in FIGS. 2 to 5 may be sequentially carried out to form conductive plug 31 on the aluminum conductive layer.

In this case, it is possible to prevent the tungsten film from suffering film delamination or reacting with $WF_6$ to produce volcanoes, without having to perform a heating treatment which is necessary in the methods of JP2001-168057A and JP11-87272A. Consequently, via hole 18 can be satisfactorily filled with tungsten film 27, a variation in the contact resistance between the aluminum conductive layer and conductive plug 31 within a plane of semiconductor substrate 11 can be reduced, and therefore, excellent contact resistance can be obtained.

Yet alternatively, conductive plug 31 may be formed on unillustrated silicon (specifically, on a doped polysilicon film or on an impurity-diffused region formed in a monocrystalline silicon substrate by an ion implantation method) by the same method as the method for forming conductive plug 31 of the present exemplary embodiment.

In this case, it is possible to prevent tungsten film 27 from suffering film delamination or reacting with $WF_6$ to produce volcanoes, without having to perform a heating treatment which is necessary in the methods of JP2001-168057A and JP11-87272A. Consequently, via hole 18 can be satisfactorily filled with tungsten film 27, a variation in the contact resistance between silicon and conductive plug 31 within a plane of semiconductor substrate 11 can be reduced, and therefore, excellent contact resistance can be obtained.

The present exemplary embodiment has been described by citing titanium film 21 as an example of a metal film to make contact with copper conductive layer 15. Alternatively, however, a film composed of at least one type of film selected from the group consisting of a Ta film, a W film, an Ru film, a Co film, an Mo film, a Zr film, a V film, an Nb film, a Cr film, and an Sn film may be formed within a strong anisotropic sputtering chamber in place of titanium film 21. In this case, it is possible to obtain the same advantageous effects as those of the present exemplary embodiment. In addition, barrier layer 25 may contain a nitride, an oxide, a boride, or a carbide.

It is apparent that the present invention is not limited to the above embodiments, but may be modified and changed without departing from the scope and spirit of the invention.

What is claimed is:

1. A semiconductor device comprising:
a conductive layer over a substrate;
an insulating layer covering the conductive layer;
a titanium film concealing at least a part of the conductive layer and covering a top surface of the insulating layer while not covering a side surface of the insulating layer in a via hole;
a first titanium nitride film including first and second portions, the first portion concealing the titanium film over the part of the conductive layer, the second portion extending along the side surface of the insulating layer in the via hole, the via hole being formed in the insulating layer exposing the part of the conductive layer, the first and second portions of the first titanium nitride film having different thicknesses;
a second titanium nitride film covering the first titanium nitride film at an upper part of the via hole; and
a conductive plug filling in the via hole through a barrier layer that includes the titanium film, the first titanium nitride film and the second titanium nitride film.

2. The semiconductor device according to claim 1, wherein the second portion of the first titanium nitride film is thinner in thickness than the first portion of the first titanium nitride film.

3. The semiconductor device according to claim 2, wherein a thickness of the second titanium nitride film at the upper part of the via hole gradually becomes thinner toward the part of the conductive layer.

4. The semiconductor device according to claim 2, wherein the second titanium nitride film at the part of the conductive layer is thinner in thickness than the first titanium nitride film.

5. The semiconductor device according to claim 3, wherein the thickness of the second titanium nitride film at the upper part of the via hole is thicker than the first titanium nitride film.

6. The semiconductor device according to claim 1, wherein the conductive plug includes tungsten that comprises a seam near a center of the via hole.

7. The semiconductor device according to claim 1, wherein the conductive layer is a copper layer.

8. The semiconductor device according to claim 1, wherein the second portion of the first titanium nitride film is substantially completely formed on the side surface of the insulating layer in the via hole.

9. The semiconductor device according to claim 1, wherein the conductive layer is an aluminum layer.

* * * * *